United States Patent
Struven

(10) Patent No.: US 6,523,557 B2
(45) Date of Patent: Feb. 25, 2003

(54) MEGASONIC BATH

(75) Inventor: Kenneth C. Struven, San Carlos, CA (US)

(73) Assignee: Imtec Acculine, Inc., Sunnyvale, CA (US)

( * ) Notice: Subject to any disclaimer, the term of this patent is extended or adjusted under 35 U.S.C. 154(b) by 57 days.

(21) Appl. No.: 09/738,463

(22) Filed: Dec. 13, 2000

(65) Prior Publication Data

US 2002/0069895 A1 Jun. 13, 2002

(51) Int. Cl.$^7$ .................................................. B08B 3/12
(52) U.S. Cl. ...................... 134/184; 134/186; 134/137; 134/138; 134/902; 310/321; 310/322
(58) Field of Search ................................ 134/1.3, 25.1, 134/25.6, 184, 902, 186, 137, 138; 310/322, 334, 321

(56) References Cited

U.S. PATENT DOCUMENTS

| | | |
|---|---|---|
| 3,893,869 A | 7/1975 | Mayer et al. |
| 5,037,208 A | 8/1991 | Dussault et al. |
| 5,090,432 A | 2/1992 | Bran |
| 5,279,316 A | 1/1994 | Miranda |
| 5,286,657 A | 2/1994 | Bran |
| 5,379,785 A * | 1/1995 | Ohmori et al. ............. 134/184 |
| 5,967,156 A | 10/1999 | Rose et al. |
| 5,996,601 A * | 12/1999 | Kern et al. ................. 134/184 |
| 6,006,765 A | 12/1999 | Skrovan et al. |
| 6,276,370 B1 * | 8/2001 | Fisch et al. .................. 134/1.3 |

FOREIGN PATENT DOCUMENTS

JP        54103265    *   8/1979    ............. B08B/3/12

* cited by examiner

Primary Examiner—Randy Gulakowski
Assistant Examiner—M. Kornakov
(74) Attorney, Agent, or Firm—Harris Zimmerman, Esq.

(57) ABSTRACT

In a substrate bath that processes substrate wafers using megasonic energy, a tank that is provided with reflecting surfaces that direct the megasonic energy to those portions of the substrates that would otherwise be sonically shadowed by the cassette that supports the substrates. In one aspect, a pair of curved wall surfaces are formed within the tank, each extending from one side wall to the bottom wall in curvilinear fashion and oriented longitudinally, the paired curved wall surfaces being disposed in laterally spaced, enantiomorpic relationship. The curved surfaces are arranged so that a significant amount of the megasonic energy impinges at an angle less than the critical angle, so that the energy is reflected in a diverging field that intersects the substrates and strikes those portions of the substrates that are shadowed by the cassette structure. Thus the megasonic cleaning, (etching or processing of the substrate) process is improved significantly.

7 Claims, 3 Drawing Sheets

MEGASONIC BATH

BACKGROUND OF THE INVENTION

This invention relates to substrate cleansing, etching or otherwise processing and more particularly to a substrate bath for optimizing megasonic cleaning, etching or otherwise processing of substrates supported therein.

In the production and manufacture of electrical components, it is a recognized necessity to be able to clean, etch or otherwise process substrates to an extremely high degree of cleanliness or uniformity. Various cleaning, etching, or stripping processes may be applied to the substrates a number of times in conjunction with the manufacturing steps to remove particulates, predeposited layers or strip resist, and the like.

One cleaning process that is often employed involves ultrasonic cleansing; that is, the application of high amplitude ultrasonic energy to the substrates in a liquid bath. More specifically, the ultrasonic energy is generally, but not limited to, the range of 0.60–1.00 MHz, and the process is termed megasonic cleaning. The liquid bath may comprise deionized water, standard cleaning solvents, dilute HF, sulfuric, phosphoric, organic strip, or the like. The amplitude and the length of time of application of the sonic energy are generally well known in the prior art.

Substrates are typically processed in batches, and likewise are generally cleaned in batches. For example, it is known in the prior art to support 20–50 substrates in a holder immersed in a megasonic bath for cleaning purposes. The holder (hereinafter, substrate cassette) maintain the substrates in a parallel array in regular spacing. It is known that megasonic energy is highly directional, and typically tends to impinge on the substrates in the cassette in an uneven manner. That is, the structural components of the substrate cassette comprise obstacles that block direct line-of-sight application of the sonic energy to some portions of some of the substrates, thereby reducing the effectiveness of the megasonic cleaning, etching, or stripping process and ultimately leading to a reduction in yield of those substrates.

One approach to overcoming this problem involves rotation of the substrates in the megasonic bath to expose all surface areas to sonic energy in a more uniform manner. Ironically, this tactic requires a cassette that is larger and more intricate than the stationary substrate cassettes, thereby blocking more of the megasonic energy. Moreover, the edge supports of the rotating substrates create friction and abrasion of the substrate edge surfaces, increasing the possibility of damage to the substrates and generation of unwanted particulates as they are being cleaned or otherwise processed.

It is also possible to physically move the megasonic transducers (or substrates in relation to the transducers) in an attempt to eliminate the shadowed areas of the substrates in the cassette. This approach also leads to similar drawbacks and complexities that are not amenable to mass production and reliable results.

SUMMARY OF THE INVENTION

The present invention generally comprises a substrate bath that makes optimal use of megasonic energy to cleanse, etch or strip the entire surfaces of the substrate wafers. In general terms, the substrate bath includes a tank that is provided with reflecting surfaces that direct the megasonic energy to those portions of the substrates that would otherwise be sonically shadowed by the cassette that supports the substrates.

In one aspect, the invention includes a tank dimensioned to receive the substrate cassette, and a cleaning liquid that fills the tank and immerses the substrates. A megasonic transducer array and housing is supported beneath the bottom wall of the tank, and is acoustically coupled to the tank bottom by a mass of liquid such as water. The megasonic energy is radiated upwardly with very little divergence of the sound field. A pair of curved wall surfaces are formed within the tank, each extending from one side wall to the bottom wall in curvilinear fashion and oriented longitudinally, the paired curved wall surfaces being disposed in laterally spaced, enantiomorphic relationship. The curved surfaces are arranged so that a significant amount of the megasonic energy impinges at an angle less than the critical angle, so that the energy is reflected in a diverging field that intersects the substrates and strikes those portions of the substrates that are shadowed by the cassette structure. Thus the megasonic cleaning, etching or processing is improved significantly.

In another aspect, the invention provides a method of carrying out a megasonic bath that includes radiating megasonic energy into a bath tank from one wall of the tank, and placing curved reflecting surfaces within the tank to diverge the sound field and obviate the sound-shadowing effect of a substrate cassette structure. The curved reflecting surfaces are preferably convex surfaces, and are placed so that they receive sonic energy from the primary source at an angle less than the critical angle, whereby reflection of a substantial portion of the sonic energy toward the substrates is achieved.

DESCRIPTION OF THE PREFERRED EMBODIMENT

Figure 1:
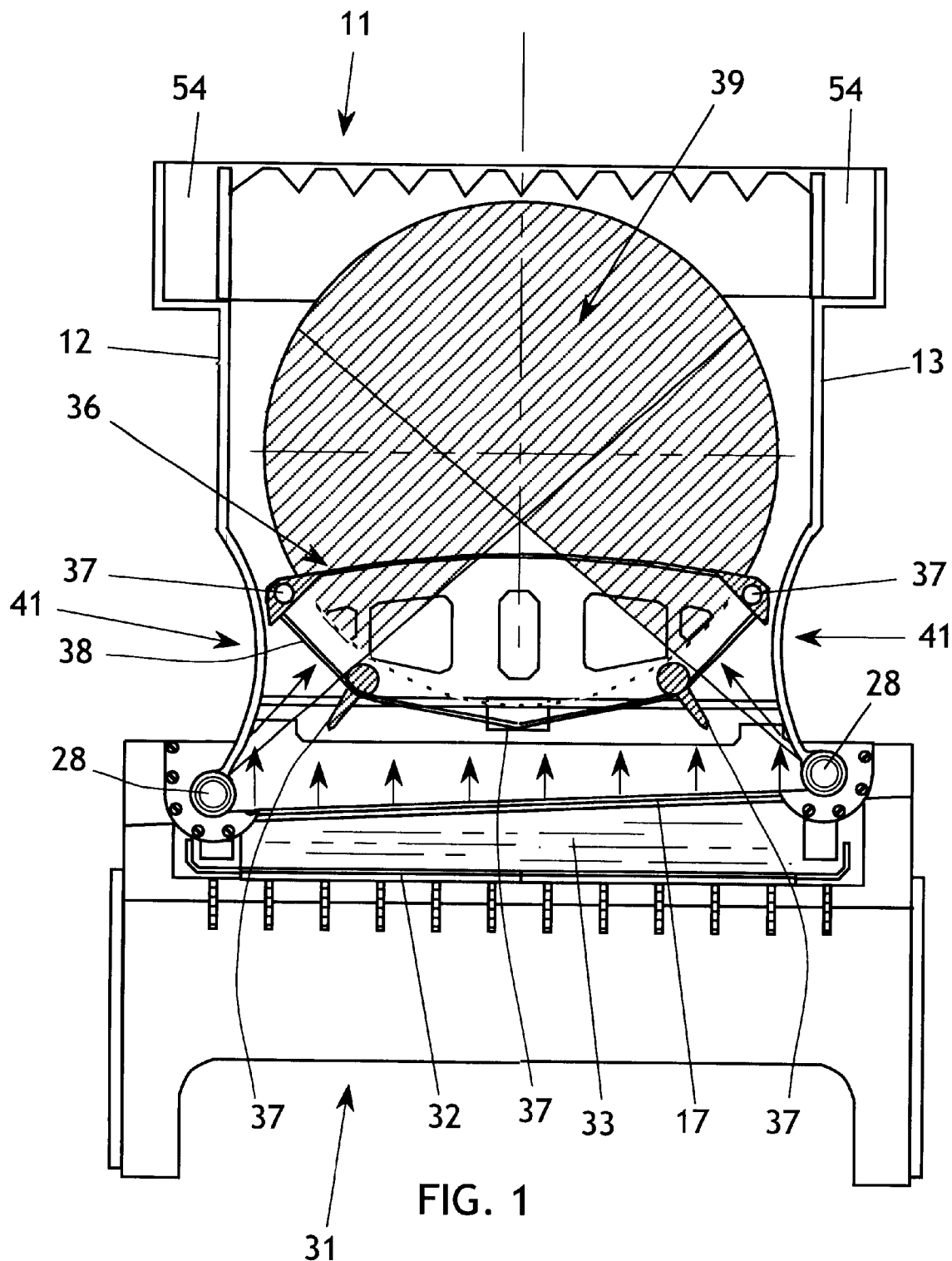
FIG. 1 is a cross-sectional elevation showing the megasonic bath construction of the present invention holding a substrate cassette.
Figure 2:
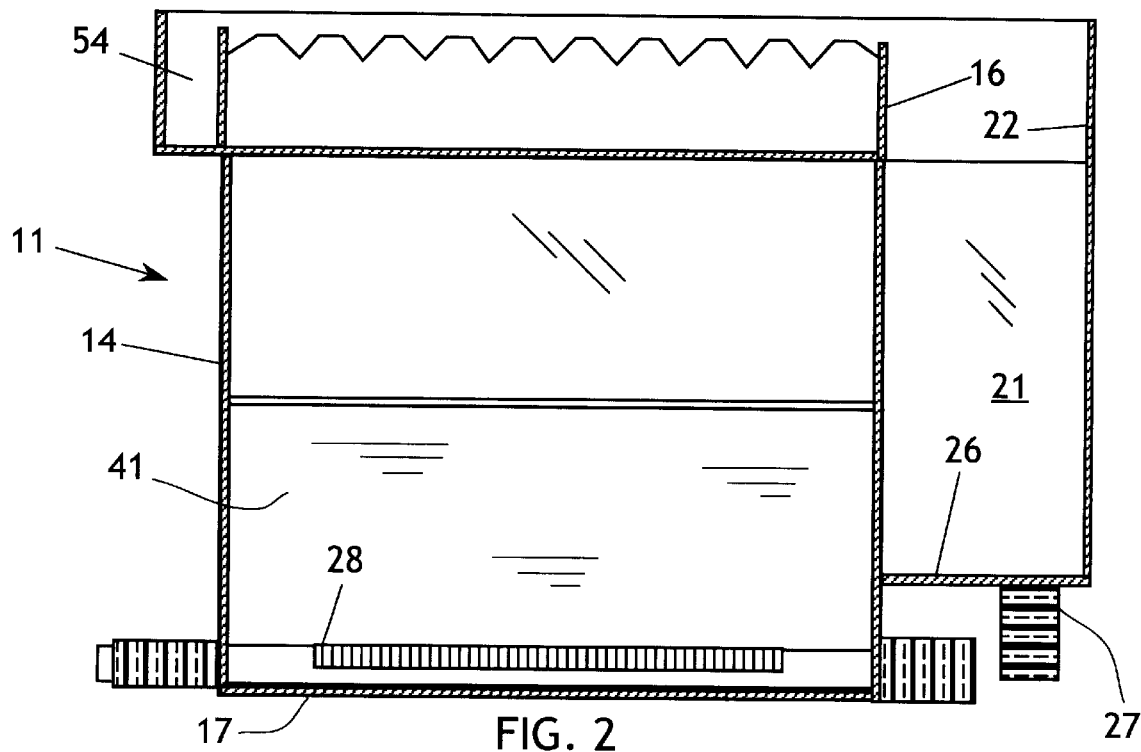
FIG. 2 is a cross-sectional side elevation showing the megasonic bath construction of FIG. 1.
Figure 3:
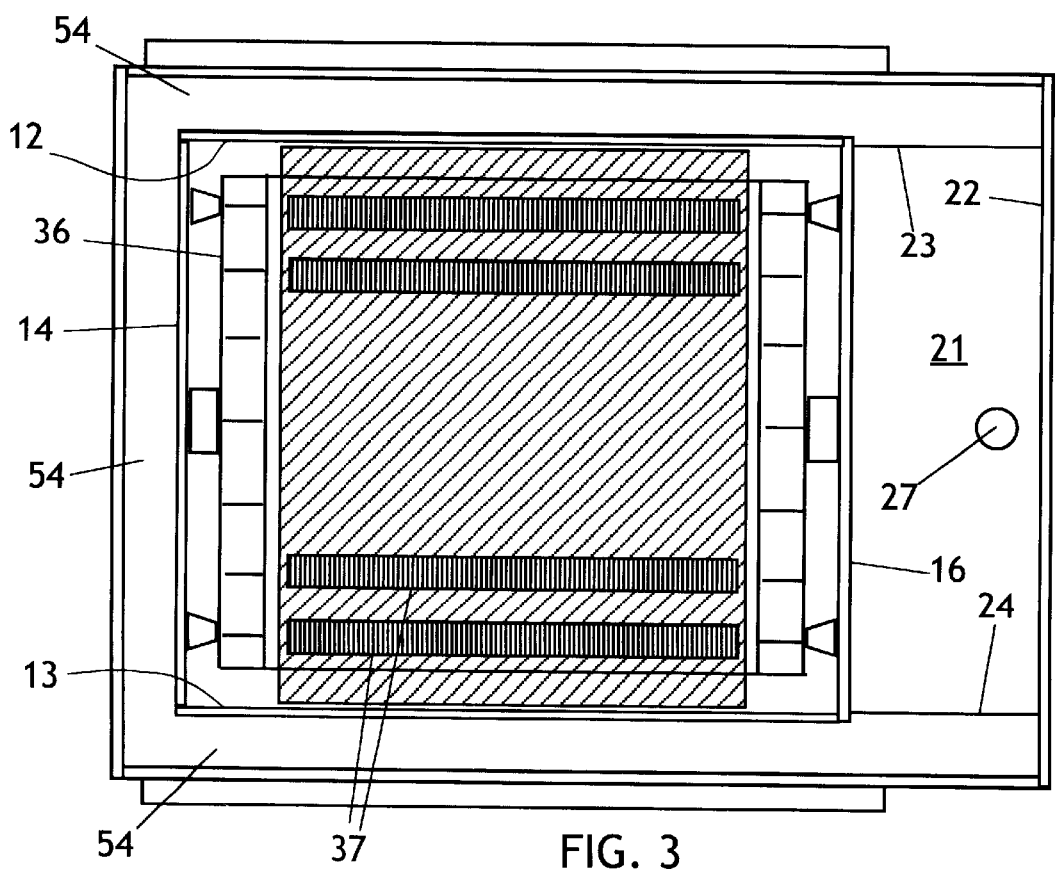
FIG. 3 is a top view of the megasonic bath construction depicted in FIGS. 1 and 2.

The present invention generally comprises a substrate bath that makes optimal use of megasonic energy to cleanse the entire surfaces of the substrate wafers. Although the invention will be described with reference to one particular design of substrate bath, as disclosed in U.S. Pat. No. 5,014,737, it is clear that the invention may be applied to a wide range of such assemblies.

With regard to FIGS. 1–4, a substrate bath generally comprises a process vessel 11 for containing a flowing chemical solution and items, such as integrated circuit wafers, to be treated by immersion in the solution. The vessel 11 is comprised of opposed, parallel side walls 12 and 13, and opposed parallel end walls 14 and 16 joining the side walls. A bottom wall 17 joins the bottom edges of the side and end walls to form a rectangular, upwardly opening coffer. The walls are preferably formed of quartz plates molded and welded together to form a leakproof container that is impervious to virtually all substances required for treatment of integrated circuit wafers, one of the most common substates processed. The quartz material is also extremely stable and chemically inert at elevated temperatures.

Directly adjacent to the vessel 11 is an integrated sump chamber 21. The sump chamber 21 is comprised of the vessel wall 16, an end wall 22 extending parallel and spaced apart therefrom, and opposed, parallel side walls 23 and 24. A bottom wall 26 joins the lower edges of the walls 16, 22–24 to form a second rectangular coffer opening upwardly. It should be noted that the walls 22–24 do not extend as high as the walls of the vessel 11, for reasons to be made apparent in the following description. A drain fitting 27 extends through a medial portion of the bottom wall 26. The walls 22–24 and 26 are also formed of quartz plates welded together to form a sealed sump that is integrally formed with the vessel 11.

Disposed at the upper portion of the vessel 11 is a trough 54, surrounding the upper extents of the side walls 12 and 13 and the end wall 14. The side portion of the trough 54 are inclined downwardly toward the sump 21, so that all liquid upwelling from the vessel 11 and overflowing the side walls and end wall 14 thereof is collected in the trough 54 and caused to flow gravitally into the sump 21. Note that the upper edges of the inner walls of the trough 54 may be crenellated to modulate the overflow into the trough. All liquid collected in the sump 21 is filtered and returned to the bottom of the vessel 11, where it is injected by the liquid dispersion tubes 28 and flows upwardly through the array of substrates being treated, over the upper edge of the vessel walls and into the trough 54, and thence back to the sump. The liquid dispersion tubes 28 extend generally parallel to the side walls, and are disposed at the intersections of the side walls and the bottom wall 17, as shown best in FIG. 1.

As also shown in FIG. 1, an ultrasonic transducer assembly 31 is secured to the bottom portion of the vessel 11. The assembly 31 includes a plate-like ultrasonic emitter 32 extending generally horizontally below the vessel bottom wall 17 and spaced apart therefrom. A mass of liquid 33 such as water is retained in the space between the bottom wall 17 and the emitter 32 by a housing supported below the vessel 11. The liquid 33 couples the ultrasonic energy directly to the bottom wall 17, which in turns radiates the energy upwardly into the vessel 11.

Figure 4:
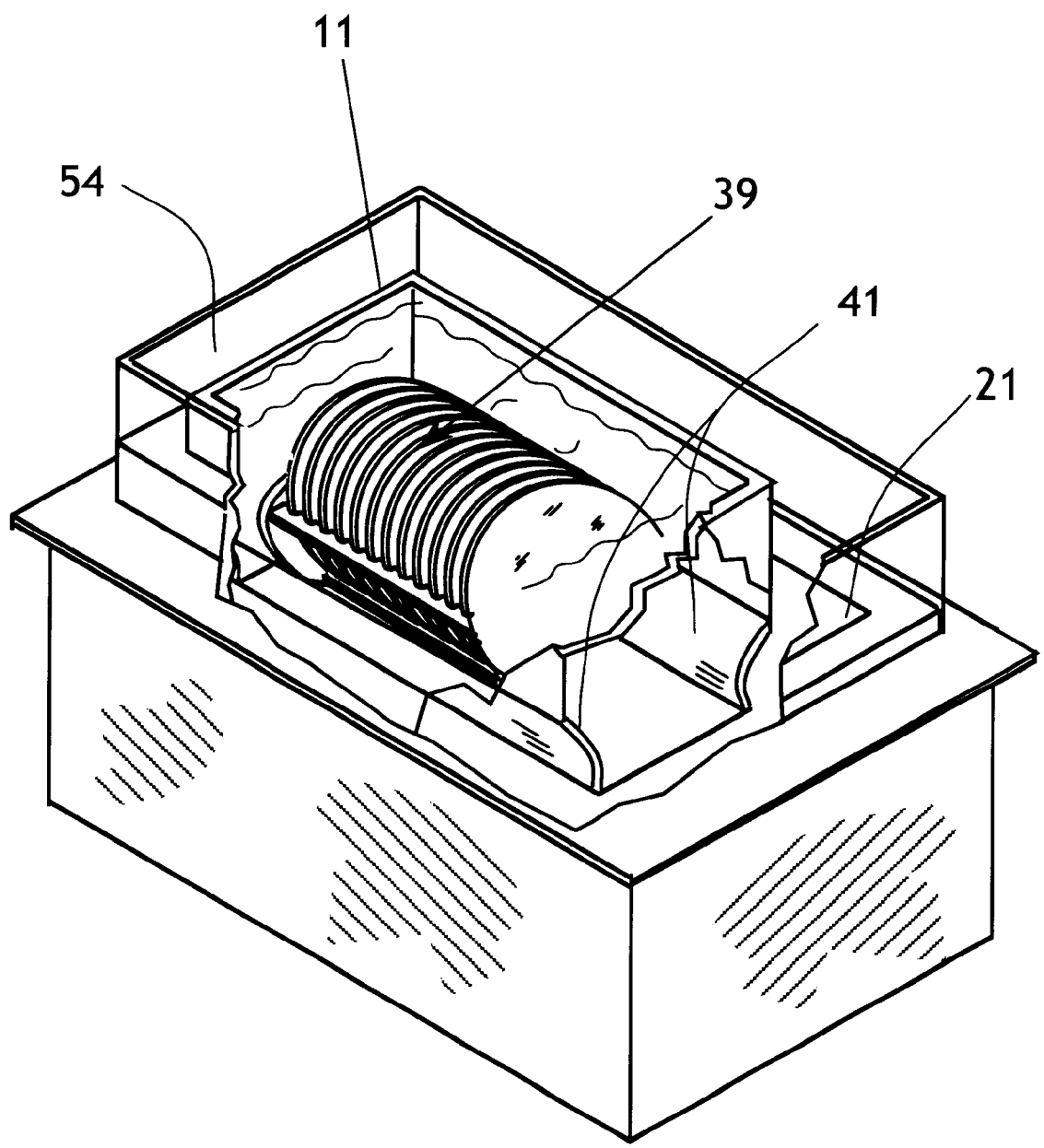
FIG. 4 is a perspective cutaway view of the megasonic bath construction of FIGS. 1–3.

A substrate carrier 36 is designed to be removably secured in the tank and immersed in a process liquid therein, whereby substrate disks may be treated. A typical substrate carrier 36 includes a plurality of ribs 37 extending longitudinally between opposed end plates 38, the ribs including aligned notches or slots to engage the edges of upstanding substrate disks (39), as shown in FIGS. 1 and 4.

It is recognized that megasonic energy is highly directional, as indicated by the arrows emanating upwardly from the emitter 32, and typically tends to impinge on the substrates 39 in the cassette 36 in an uneven manner. That is, the structural components such as the ribs 37 comprise obstacles that block direct line-of-sight application of the sonic energy to some portions of some of the substrates 39, thereby reducing the effectiveness of the megasonic cleaning, etching, or stripping process and ultimately leading to a reduction in yield of those substrates.

A salient feature of the invention is the provision of surfaces in the vessel 11 for redirecting some of the ultrasonic energy that emanates from the bottom wall 17. (Note that other arrangements for radiating ultrasonic energy through other wall portions of the vessel may be used, and the invention may be applied to any such arrangement.) In this embodiment, a pair of curved wall portions 41 are placed in the otherwise planar side walls 12 and 13, the curved wall surfaces extending upwardly each from a respective junction with the bottom wall and being disposed in laterally spaced, enantiomorpic relationship. The curved wall portions may comprise longitudinal sections of a cylindrical quartz pipe. The curved surfaces are arranged so that a significant amount of the megasonic energy impinges at an angle less than the critical angle, so that the energy is reflected in a diverging field that intersects the substrates and strikes those portions of the substrates that are shadowed by the cassette structure. In particular, the radiating surface portions of the bottom wall 17 that are disposed not below the substrates tend to radiate ultrasonic energy that impinges on the convex inner surfaces of the wall portions 41. The angle of impingement in this embodiment is in the range of 0°–26°, which is less than the critical angle of quartz. As a result, the curved wall portions 41 disperse the incident energy as they reflect it, which re-radiates sonic energy onto the substrates 39. The re-radiated energy illuminates the substrates as indicated by the hatched area of the substrate 39 of FIG. 1. This illuminated area covers a large portion of the ultrasonically shaded portions of the substrates due to the shadowing effect of the cassette ribs, as described above. Thus the curved dispersive surfaces of the invention overcome a significant processing problem in the prior art.

It may be noted that the invention may provide other reflecting surfaces within the vessel 11, which may be curved or planar. For example, other wall portions of the vessel may be provided with convex curved portions, or solid or tubular convex bodies may be placed within the tank to form dispersive reflections, or planar surface may be disposed to reflect the ultrasonic energy to illuminate the shadowed areas of the substrates.

It is noted that materials other than quartz may be employed for some or all of the structural components of the system described herein without diverging from the spirit or teachings of the invention. Each material chosen has a respective critical angle for the incident ultrasonic energy, and this factor must be considered in forming and placing the reflective surfaces.

The foregoing description of the preferred embodiment of the invention has been presented for purposes of illustration and description. It is not intended to be exhaustive or to limit the invention to the precise form disclosed, and many modifications and variations are possible in light of the above teaching without deviating from the spirit and the scope of the invention. The embodiment described is selected to best explain the principles of the invention and its practical application to thereby enable others skilled in the art to best utilize the invention in various embodiments and with various modifications as suited to the particular purpose contemplated. It is intended that the scope of the invention be defined by the claims appended hereto.

What is claimed is:

1. In a substrate treatment bath comprised of a vessel for containing a process liquid and having a megasonic transducer radiating ultrasonic energy into said bath, the improvement comprising:

means for reflecting and dispersing said ultrasonic energy within said vessel, said means including at least two convex curved surfaces disposed in said vessel and oriented to reflect incident ultrasonic energy from said transducer;

said transducer being acoustically coupled to a bottom wall of said vessel, and said at least two convex curved wall portions are disposed to receive ultrasonic energy substantially directed radiated from said bottom wall;

structural component means for supporting a plurality of substrates in said vessel, said structural component means being interposed between said bottom wall and said plurality of substrates and disposed to inadvertently produce acoustically shadowed portions of said substrates; and, said at least two convex curved surfaces being disposed to reflect ultrasonic energy from said bottom wall to illuminate at least some of said acoustically shadowed portions of the substrates.

2. The improved substrate treatment bath of claim 1, wherein said at least two convex curved surfaces are oriented to receive the ultrasonic energy emanating from said transducer at an angle less than the critical angle for the material that forms said convex curved surfaces.

3. The improved substrate treatment bath of claim 1 further including at least a pair of convex curved wall portions, said wall portions being integrally formed in wall surfaces of said vessel.

4. The improved substrate treatment bath of claim 3, wherein said pair of convex curved wall portions are disposed in opposed, enantiomorphic relationship.

5. The improved substrate treatment bath of claim 4, wherein said vessel includes opposed, spaced apart side walls, and said convex curved wall portions are each incorporated in one of said side walls of said vessel.

6. The improved substrate treatment bath of claim 5, wherein said vessel includes a bottom wall extending between said side walls, and said convex curved wall portions each extend curvilinearly from said bottom wall to a respective side wall of said vessel.

7. The improved substrate treatment bath of claim 1, further including a substrate cassette for supporting a plurality of substrates in said bath.

* * * * *